US009118331B2

(12) United States Patent
Iwata et al.

(10) Patent No.: US 9,118,331 B2
(45) Date of Patent: Aug. 25, 2015

(54) CONTACT STATE DETECTION APPARATUS

(71) Applicants: Futoshi Iwata, Hamamatsu (JP); Toshio Shiomi, Hamamatsu (JP); Koji Suzuki, Hamamatsu (JP)

(72) Inventors: Futoshi Iwata, Hamamatsu (JP); Toshio Shiomi, Hamamatsu (JP); Koji Suzuki, Hamamatsu (JP)

(73) Assignee: National University Corporation Shizuoka University, Shizuoka (JP)

( * ) Notice: Subject to any disclaimer, the term of this patent is extended or adjusted under 35 U.S.C. 154(b) by 194 days.

(21) Appl. No.: 13/744,587

(22) Filed: Jan. 18, 2013

(65) Prior Publication Data

US 2014/0203168 A1 Jul. 24, 2014

(51) Int. Cl.
| H01L 27/00 | (2006.01) |
| G06M 7/00 | (2006.01) |
| G01N 21/86 | (2006.01) |
| H03K 17/968 | (2006.01) |
| H01L 21/02 | (2006.01) |
| G01B 21/16 | (2006.01) |
| G01R 1/067 | (2006.01) |

(52) U.S. Cl.
CPC .............. *H03K 17/968* (2013.01); *G01B 21/16* (2013.01); *G01R 1/06794* (2013.01); *H01L 21/02* (2013.01)

(58) Field of Classification Search
CPC ........ G01B 11/02; G01B 21/16; G01R 1/073; G01R 27/14; G01R 31/00; G01R 31/28; G01R 1/06794; H01L 21/66; H01L 21/02; H03K 17/968
USPC .............................. 250/234, 208.1, 306, 221, 250/559.04–559.08, 559.29; 359/368, 369, 359/656; 257/773, 776, 739; 324/234, 239, 324/226, 227, 90
See application file for complete search history.

(56) References Cited

U.S. PATENT DOCUMENTS

2002/0153909 A1* 10/2002 Petersen et al. ............... 324/754
2004/0152211 A1* 8/2004 Majumdar et al. ............ 436/518

FOREIGN PATENT DOCUMENTS

EP 0 974 845 A1 * 7/1998 ............. G01R 1/073
EP 1 686 387 A1 * 1/2005
(Continued)

OTHER PUBLICATIONS

Bøggild et al.,Direct Measurement of the Microscale Conductivity of Conjugated Polymer Monolayers, Jun. 2000, Advanced Materials, vol. 12 (13), 947-950.*
Petersen et al., Scanning microscopic four-point conductivity probes, Jan. 31, 2002, Sensors and Actuators A, vol. 96 (1), 53-58.*
(Continued)

*Primary Examiner* — Georgia Y Epps
*Assistant Examiner* — Vildana Hodzic
(74) *Attorney, Agent, or Firm* — Michael Tobias

(57) ABSTRACT

A contact state detection apparatus which can accurately detect the pressed state of a contact body such as a probe against an object without damaging the contact body or the object includes a contact body approach section, a probe light source, an imaging device, and a computer unit. The contact body approach section holds a contact body in an inclined attitude with respect to a target contact surface of an object, and displaces the contact body toward the object. The probe light source irradiates light toward the contact body which is being displaced toward the object. The imaging device captures an image of the illuminated contact body and outputs contact body captured image information to the computer unit. The computer unit detects the state of the contact body being pressed against the object based on a change in the contact body captured image information.

20 Claims, 9 Drawing Sheets

124: FOUR-PROBE MEASUREMENT CIRCUIT

(56) References Cited

FOREIGN PATENT DOCUMENTS

| | | | |
|---|---|---|---|
| EP | 1 970 714 A1 * | 3/2007 | |
| EP | 2 237 052 A1 * | 3/2009 | ............ G01R 31/28 |
| JP | 06258068 | 9/1994 | |
| JP | 10206433 | 8/1998 | |
| JP | 11183160 | 7/1999 | |
| JP | 11248800 | 9/1999 | |
| JP | 2004310548 | 11/2004 | |

OTHER PUBLICATIONS

Lin et al., Optical detection of ion diffusion in electrochromic poly(3,4-ethylenedioxy)thiophene film using microcantilever electrodes, Jul. 22, 2005, Thin Solid Films, vol. 484 (1-2), 334-340.*

L. B. Valdes, Resistivity Measurements on Germanium for Transistors, Feb. 1954, Proceedings of the IRE, vol. 42 , 420-427.*

* cited by examiner

124: FOUR-PROBE MEASUREMENT CIRCUIT (A)　　　　　　　(B)

(A)

(B)

(C)

(A)

(B)

(A)

(B)

(A)

(B)

124: FOUR-PROBE MEASUREMENT CIRCUIT
137: VOLTAGE APPLICATION DEVICE

CONTACT STATE DETECTION APPARATUS

TECHNICAL FIELD

The present invention relates to a contact state detection apparatus, a contact state detection method, and a contact state detection program which detect when a contact body which deforms upon contact with an object has come into contact with the object. The present invention also relates to an electrical conductivity measurement system provided with the contact state detection apparatus, and an electrical conductivity measurement method employing the contact state detection method.

BACKGROUND ART

Conventionally, the volume resistivity (electrical conductivity) of the surface of a thin film of an electronic device or the like has been measured using four microterminals. In the electrical conductivity measurement, four very small probes having a size of several μm to several tens of μm are brought into contact with a target contact portion, and a current is supplied thereto so as to measure the volume resistivity of that portion. In this case, a tunnel current detection method or an optical lever method is used so as to detect contact of the four probes with the target contact portion.

In the tunnel current detection method, a bias voltage is applied between a probe and a target contact portion such that a tunnel current is produced when the probe approaches the target contact portion with a distance of about 1 nm remaining therebetween. Contact of the probe with the target contact portion is detected by detection of the tunnel current. In the optical lever method, as disclosed in, for example, Japanese Patent Application Laid-Open (kokai) No. H06-258068, a laser beam is applied to the back surface of a contact portion of a cantilever (corresponding to a probe), and light reflected from the back surface of the cantilever is received by a bi-cell (or tetra-cell) photodetector. Contact between the probe and the target contact portion is detected based on a change in the position where the light is received.

However, the tunnel current detection method has a problem. In the case where an insulating region is formed by, for example, an oxide film naturally formed on a target contact portion, the current flowing between a probe and the target contact portion cannot be detected accurately. In such a case, the probe is strongly pressed against the target contact portion, and the probe and the target contact portion may be damaged. The optical lever method also has a problem. Optical components for causing a laser beam to impinge on the cantilever and causing the reflected light from the cantilever to impinge on the photodetector are necessary, and adjustment of alignment is also necessary. Therefore, the structure of a measuring apparatus becomes complex, and maintenance work for maintaining adequate detection accuracy is very troublesome.

SUMMARY OF THE INVENTION

The present invention was made to cope with the above-mentioned problems, and an object of the invention is to provide a contact state detection apparatus, a contact state detection method, and a computer program for contact state detection which can accurately detect, using a simple configuration, the state of contact of a contact body such as a probe with an object without damaging the contact body or the object.

In order to achieve the above-described object, the present invention provides a contact state detection apparatus. According to one form of the present invention, the contact state detection apparatus comprises a light irradiating device which irradiates a region including a deformable portion of a contact body with light, which portion deforms upon contact with an object; an image capturing device which captures an image of the deformable portion of the contact body and outputs contact body captured image information, the image capturing device being disposed outside an optical path along which reflected light from a surface of the object propagates, the reflected light being a portion of the light from the light irradiating device; and a contact state detection device which detects a state of the contact body being pressed against the object based on a change in the region of the reflected light from the deformable portion represented by the contact body captured image information. In this case, the detection of the pressed state refers to detection of the degree (extent) to which the contact body which has come into contact with the object presses the object, and does not mean detection of the magnitude of the pressing force. In this form of the present invention, the contact state detection apparatus irradiates, with light, a region including a deformable portion of a contact body which is displaced toward an object and deforms upon contact with the object, and detects the state of the contact body being pressed against the object based on a change in the region of the reflected light represented by the contact body captured image information obtained by capturing the image of the deformable portion. Namely, the contact state detection apparatus detects the state of the contact body being pressed against the object by detecting, from a change in the contact body captured image information, a change in the region of the reflected light from the deformable portion, the change in the region occurring because the contact body has deformed as a result of contact with the object. In this case, the deformable portion of the contact body irradiated with light from the light irradiating device is a portion of the contact body which changes in shape or direction when the contact body comes into contact with the object compared with the state before the contact body comes into contact with the object. For example, the deformable portion corresponds to a region of the contact body extending from a portion which comes into contact with the object to a portion which deforms upon contact with the object. The change in the region of the reflected light refers to a change in a two-dimensional plane (e.g., a change in area, position, shape, etc.) of the reflected light represented by the contact body captured image information. The detection of the reflected light from the contact body is performed by capturing an image of the region including the deformable portion of the contact body using any of various imaging devices such as a CCD (Charge Coupled Device) image sensor and a CMOS (Complementary Metal Oxide Semiconductor) image sensor. Namely, the position from which the light is irradiated and the position at which the reflected light is received need not be finely adjusted. Therefore, the number of optical components for determining the position at which light is irradiated on the contact body and positioning the reflected light from the contact body with respect to a light receiving element can be decreased, and the man-hours required for alignment adjustment can also be decreased. In addition, the structure of the detection apparatus can be simplified, and the work load associated with maintenance work for maintaining adequate detection accuracy can be reduced. Also, since the image capturing device which captures the image of the deformable portion of the contact body is disposed outside the optical path of the reflected light from the surface of the object, the contact state detection device can accurately detect a change in the region of the deformable portion without being influenced by the reflected light from the surface of the object. Since the contact state detection apparatus detects the pressed state of the contact body on the basis of mechanical deformation of the contact body, the pressed state of the contact body can be detected accurately even when an insulating region such as oxide film is formed on a target contact portion of the object with which the contact body comes into contact. Thus, it becomes possible to prevent the contact body and the object from being damaged as a result of the contact body being strongly pressed against the object. As a result, the state of the contact body being pressed against the object can be accurately detected by a simple configuration without damaging the contact body or the object.

The contact state detection device may detect the state of the contact body being pressed against the object based on a change in the area of the reflected light represented by the contact body captured image information. In this case, the contact state detection apparatus can detect the pressed state of the contact body through use of a change in the luminous energy (the amount of light) of the reflected light represented by the contact body captured image information, instead of or in addition to a change in the area of the reflected light.

According to this feature of the present invention, the contact state detection apparatus can detect the pressed state of the contact body based on a change in the area of the reflected light represented by the contact body captured image information. With this configuration, the contact state detection apparatus can simply detect the contact state of the contact body from a change in the area of the reflected light.

The contact state detection device may detect the state of the contact body being pressed against the object through use of a portion of the deformable portion represented by the contact body captured image information.

According to this feature, the contact state detection apparatus can detect the state of the contact body being pressed against the object through use of a portion of the deformable portion represented by the contact body captured image information. By virtue of this configuration, the pressed state can be detected accurately by removing the influence of noise contained in the captured image information (the SN ratio can be increased), and the position and/or range in which the pressed state is detected, the sensitivity of detection of the pressed state, and the pressing force of the contact body against the object WK can be freely set by setting the region used for detection of the pressed state.

The contact state detection device may binarize the contact body captured image information in accordance with the amount of light and detect the state of the contact body being pressed against the object on the basis of the binarized contact body captured image information.

With this arrangement, the contact state detection apparatus detects the pressed state of the contact body using contact body captured image information obtained by binarizing, in accordance with a predetermined luminous energy (the amount of light) (also referred to as brightness or lightness), the contact body captured image information obtained by capturing the image of the contact body. By virtue of this configuration, the state of the contact body being pressed against the object can be quickly detected, with a reduced calculation processing load, through use of the contact body captured image information representing the captured image of the contact body.

The image capturing device may be disposed on an optical path determined by the angle of reflection of the light irradiated on the region including the deformable portion of the contact body.

With this arrangement, since the image capturing device of the contact state detection apparatus is disposed on the optical path determined by the angle of reflection of the light irradiated on the region including the deformable portion of the contact body, the reflected light from the contact body can be accurately captured. Thus, the accuracy in detecting the pressed state by the contact state detection apparatus can be improved. Also, the reflected light can be led to the image capturing device more efficiently by using a highly directional light source (e.g., an LED), whereby the accuracy in detecting the pressed state of the contact body by the contact state detection apparatus can be improved.

The contact state detection apparatus may comprise a contact body displacement device which displaces the contact body toward the object while holding the contact body in an attitude such that the contact body is inclined with respect to a surface of the object including a target contact portion with which the contact body comes into contact.

With this arrangement, the contact state detection apparatus comprises a contact body displacement device which displaces the contact body toward the object while holding the contact body in an attitude such that the contact body is inclined with respect to a surface of the object including a target contact portion with which the contact body comes into contact. Namely, a portion of the contact body illuminated with light is not parallel to the surface of the object including the target contact portion with which the contact body comes into contact. Therefore, even when a portion of the light irradiated from the contact body illumination device reaches the object, the reflected light from the contact body and the reflected light from the object are prevented from reaching the image capturing device at the same time. Thus, only the reflected light from the contact body can be captured accurately, whereby the accuracy in detecting the pressed state of the contact body by the contact state detection apparatus can be improved.

The contact body displacement device in the contact state detection apparatus may displace the contact body relative to the object along the surface of the object including the target contact portion with which the contact body comes into contact.

With this arrangement, the contact state detection apparatus can displace the contact body along the surface of the object by the contact body displacement device. Thus, the contact state detection apparatus can detect the pressed state of the contact body at an arbitrary position on the object, whereby the range of use or application of the contact state detection apparatus can be expanded.

The contact state detection apparatus may comprise an object illumination device which illuminates the object with light, wherein the image capturing device captures an image of the object and outputs object captured image information.

With this arrangement, the contact state detection apparatus comprises an object illumination device which illuminates the object with light, and the image capturing device outputs object captured image information obtained by capturing the image of the object. By virtue of this configuration, the contact state detection apparatus can specify the position of the contact body on the object through use of the object captured image information, whereby the range of use or application of the contact state detection apparatus can be expanded.

The contact state detection apparatus may further comprise a captured image display device which displays the image captured by the image capturing device.

With this arrangement, the contact state detection apparatus comprises a captured image display device which displays the image captured by the image capturing device. By virtue of this configuration, the operator who detects the contact of the contact body using the contact state detection apparatus can visually check the state of the contact body being pressed against the object and the positional relation between the contact body and the object, whereby the usability of the contact state detection apparatus can be improved.

The contact state detection apparatus may further comprise an electrical contact detection device which detects electrical contact between the object and the contact body, each of which is formed of a conductor. In this case, the electrical contact detection device can detect electrical contact between the object and the contact body by applying a voltage between the object and the contact body and detecting the current flowing between the object and the contact body, or by forming two probes to which a voltage can be applied on the contact body and detecting the current between the two probes via the object.

With this arrangement, the contact state detection apparatus comprises an electrical contact detection device which detects electrical contact between the object and the contact body, each of which is formed of a conductor. Thus, the contact state detection apparatus can detect contact of the contact body with the object by detecting physical contact and electrical contact therebetween. By virtue of this configuration, the contact state detection apparatus can determine that the contact body has come into contact with the object when the contact body has come into contact with the object physically or electrically or when the contact body has come into contact with the object physically and electrically, whereby the range of use or application of the contact state detection apparatus can be expanded.

According to another form of the present invention, a contact state detection apparatus may comprise a contact body displacement device which holds a contact body which deforms upon contact with an object and displaces the contact body in relation to the object in a direction for bringing the contact body into contact with the object; a light irradiating device which irradiates a region including a deformable portion of the contact body with light, which portion deforms upon contact with the object; an image capturing device which captures an image of the deformable portion of the contact body and outputs contact body captured image information, the image capturing device being disposed outside an optical path along which reflected light from a surface of the object propagates, the reflected light being a portion of the light from the light irradiating device; and a captured image display device which displays the captured image on the basis of the contact body captured image information output from the image capturing device.

With this arrangement, the contact state detection apparatus irradiates light on a region including the deformable portion of the contact body which displaces toward the object and deforms upon contact with the object and causes the captured image display device to display the contact body captured image information obtained by capturing the image of the deformable portion. By virtue of this configuration, an operator who detects contact of the contact body with the object through use of the contact state detection apparatus can visually check the state of the contact body being pressed against the object by viewing the captured image display device and, for example, can immediately stop the displacement of the contact object toward the object on the basis of the result of the detection. In this case, since the image capturing device which captures the image of the deformable portion of the contact body is disposed outside the optical path of the reflected light from the surface of the object, the operator can accurately detect a change in the region of the deformable portion displayed on the captured image display device without being influenced by the reflected light from the surface of the object. Namely, it is expected that this form of contact state detection apparatus according to the present invention achieves an action and effect similar to those provided by the above-described contact state detection apparatus.

The present invention can be implemented not only as a contact state detection apparatus, but also as a computer program for contact state detection which is used for the contact state detection method and the contact state detection apparatus, as an electrical conductivity measurement system including the contact state detection apparatus, and as an electrical conductivity measurement method including the contact state detection method.

For example, the present invention can be implemented as a contact state detection method comprising a light irradiating step of irradiating a region including a deformable portion of a contact body with light, which portion deforms upon contact with an object; an image capturing step of capturing an image of the deformable portion of the contact body and outputting contact body captured image information, the image being captured at a position outside an optical path along which reflected light from a surface of the object propagates, the reflected light being a portion of the light from the light irradiating device; and a contact state detection step of detecting a state of the contact body being pressed against the object based on a change in the region of the reflected light from the deformable portion represented by the contact body captured image information.

The present invention can also be implemented as a contact state detection program used for a contact state detection apparatus which detects the contact state of a contact body against an object and which comprises a contact body displacement device which holds a contact body which deforms upon contact with an object and displaces the contact body in relation to the object in a direction for bringing the contact body into contact with the object; a light irradiating device which irradiates a region including a deformable portion of the contact body with light, which portion deforms upon contact with the object; and an image capturing device which captures an image of the deformable portion of the contact body and outputs contact body captured image information, the image capturing device being disposed outside an optical path along which reflected light from a surface of the object propagates, the reflected light being a portion of the light from the light irradiating device, the contact state detection program being characterized in that, in a state in which the region containing the deformable portion of the contact body is irradiated with light by the light irradiating device, the program causes a computer provided in the contact state detection apparatus to cause the held contact body displacement device to displace the contact body in relation to the object in the direction for bringing the contact body into contact with the object, cause the image capturing device to capture an image of the deformable portion of the contact body and output contact body captured image information, and detect a state of the contact body being pressed against the object based on a change in the region of the reflected light from the deformable portion represented by the contact body captured image information.

The present invention can additionally be implemented as an electrical conductivity measurement system comprising a contact state detection apparatus according to the present invention; and an electrical conductivity measurement device connected to the contact body of the contact state detection apparatus and measuring the electrical conductivity of the object by bringing the contact body into contact with the object, the contact state detection apparatus detecting the state of contact between the contact body and the object, wherein the electrical conductivity measurement device performs the measurement of the electrical conductivity of the object in accordance with the result of detection of the contact body being pressed against the object detected by the contact state detection device. This configuration allows measurement of the electrical conductivity of the object while achieving an action and an effect similar to those of the above-described contact state detection apparatus.

In this case, the electrical conductivity measurement system preferably comprises a voltage application device connected to the contact body and applying to the contact body a voltage for causing insulation breakdown between the contact body and the object. By virtue of this configuration, in the case where an insulating film is formed on the surface of the object and the contact body does not come into electrical contact with the object even through the contact body comes into physical contact with the object, the insulating film can undergo breakdown by the voltage application device, whereby electrical contact can be established between the contact body and the object.

It is also possible to implement the present invention as an electrical conductivity measurement method including detecting a state of contact between a contact body and an object by the above-described contact state detection method and measuring the electrical conductivity of the object in accordance with the result of detection of the contact body being pressed against the object. This method allows measurement of the electrical conductivity of the object while achieving an action and an effect similar to those of the above-described contact state detection method.

BRIEF DESCRIPTION OF THE DRAWINGS

FIGS. 3(A) and 3(B) show optical paths of light emitted from a workpiece light source in the contact state detection apparatus shown in FIG. 1, wherein FIG. 3(A) is a schematic diagram showing the optical path of light applied to the contact body, and FIG. 3(B) is a schematic diagram showing the optical path of light applied to an object.

FIGS. 4(A) to 4(C) are diagrams showing the state in which light is emitted from a probe light source in the contact state detection apparatus shown in FIG. 1, wherein FIG. 4(A) is a schematic diagram showing the optical path of light applied to the contact body, FIG. 4(B) is a schematic diagram showing the optical path of light applied to the object, and FIG. 4(C) is an explanatory illustration showing an image displayed on a display device when light is emitted from the probe light source.

FIGS. 7(A) and 7(B) are illustrations used for describing a process of detecting contact of the contact body in the contact state detection apparatus shown in FIG. 1, wherein FIG. 7(A) is a schematic illustration showing a state in which the contact body starts to come into contact with the surface of the object, and FIG. 7(B) is an explanatory illustration showing an image displayed on the display device when the contact body starts to come into contact with the surface of the object.

FIGS. 8(A) and 8(B) are illustrations used for describing the process of detecting contact of the contact body in the contact state detection apparatus shown in FIG. 1, wherein FIG. 8(A) is a schematic illustration showing a state in which contact of the contact body with the surface of the object has proceeded, and FIG. 8(B) is an explanatory illustration showing an image displayed on the display device when contact of the contact body with the surface of the object has proceeded.

FIGS. 9(A) and 9(B) are diagram showing the state in which light is emitted from a probe light source in a contact state detection apparatus according to a modification of the present invention, wherein FIG. 9(A) is a schematic diagram showing the optical path of light applied to the contact body, and FIG. 9(B) is a schematic diagram showing the optical path of light when the contact body comes into contact with the object.

DESCRIPTION OF PREFERRED EMBODIMENTS

Figure 1:
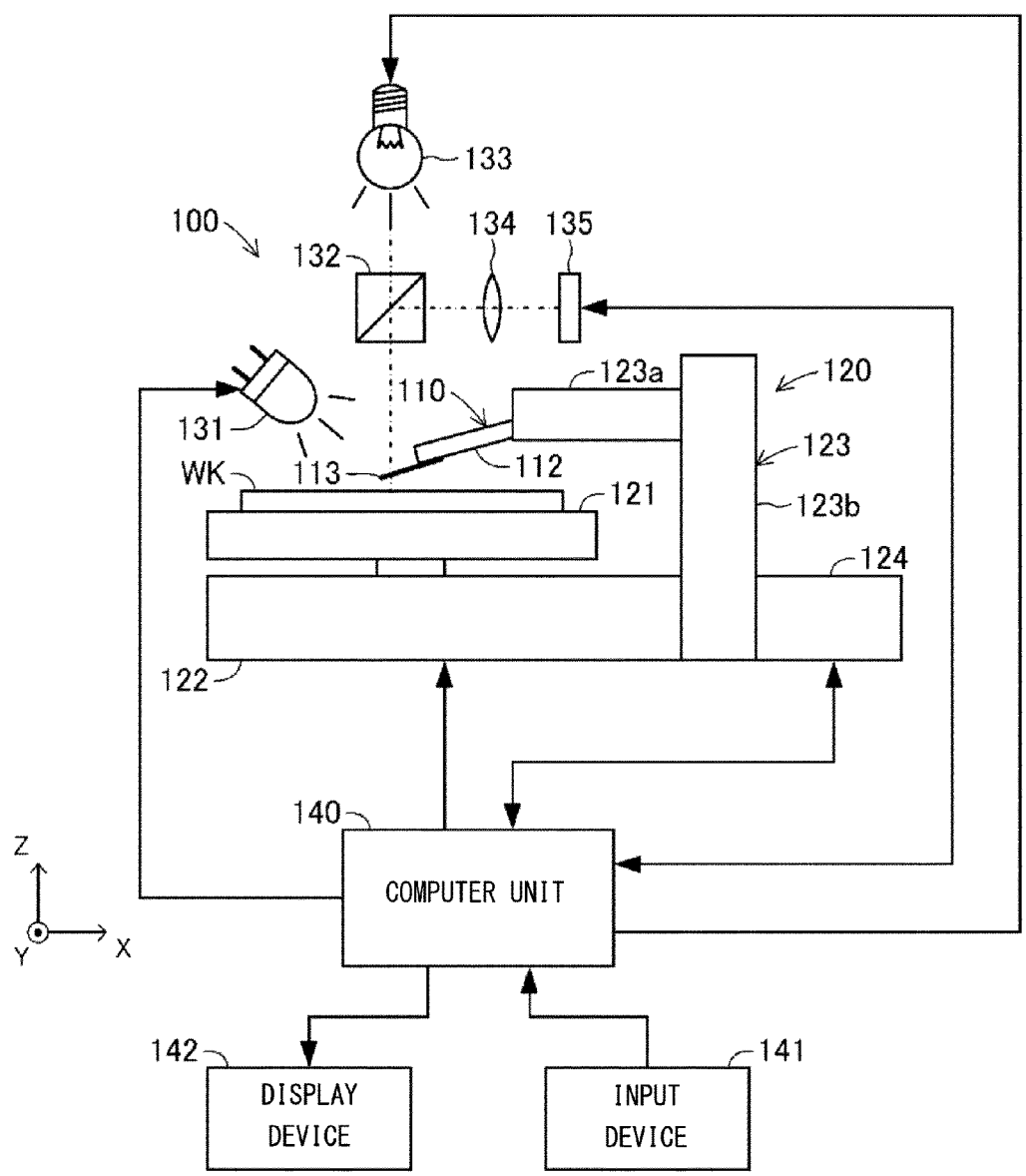
FIG. 1 is a block diagram schematically showing the configuration of an electrical conductivity measurement system including a contact state detection apparatus according to the present invention.

An embodiment of a contact state detection apparatus according to the present invention will now be described with reference to the drawings. FIG. 1 is a block diagram schematically showing the configuration of an electrical conductivity measurement system 100 which includes a contact state detection apparatus according to the present invention. In each of the drawings which will be referred to herein, some constituent elements are shown schematically, such as in an exaggerated manner. Therefore, the dimensions, dimensional ratios, etc. of the constituent elements may differ from the actual dimensions, dimensional ratios, etc. The electrical conductivity measurement system 100 is an inspection apparatus which measures the volume resistivity (electrical conductivity) of a surface of an object WK to be measured by the four-probe measurement method. In the four-probe measurement method, four needle-like probes arranged in a row are brought into contact with a sample so as to measure the volume resistivity (electrical conductivity) of the sample itself. More specifically, a prescribed current is made to flow between two outer probes of the four probes, and the voltage between two inner probes is measured in a region between the two probes. Thus, the volume resistivity (electrical conductivity) of the sample itself is measured with so-called wiring resistance and contact resistance eliminated.

(Configuration of the Contact State Detection Apparatus)

The electrical conductivity measurement system 100 has an approach stage unit 120 which holds the object WK, the volume resistivity of which is to be measured by the electrical conductivity measurement system 100, and which also holds a contact body 110 which is made to come into contact with the object WK. No particular limitation is imposed on the object WK so long as the object WK is a sample for which the electrical conductivity at the surface can be measured (e.g., ingots and wafers made of various materials, various layers such as ion implanted layers and diffusion layers, and various thin films such as thin metal films and thin silicon films). In the present embodiment, the object WK is a sample having a thin metal film on a plate-like semiconductor.

Figure 2:
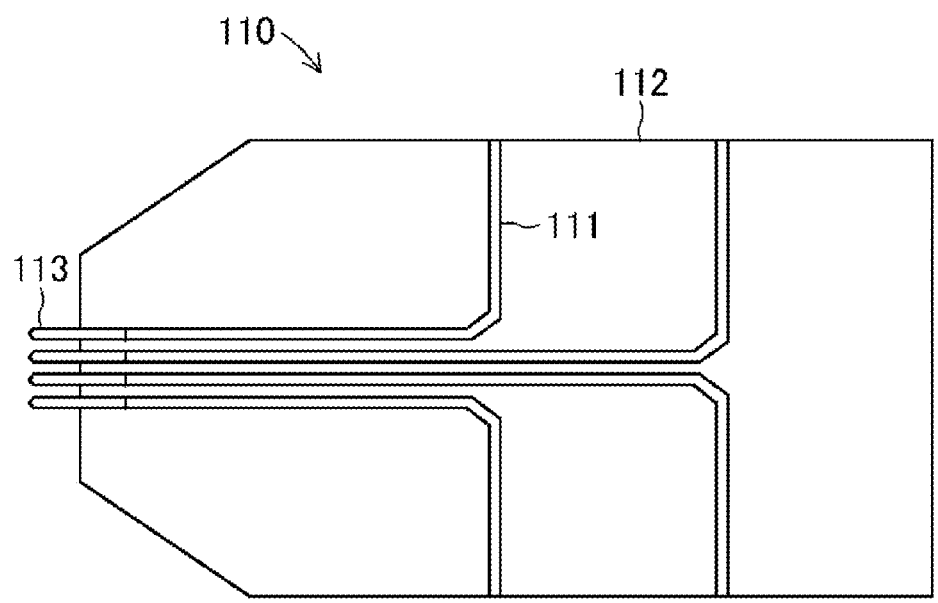
FIG. 2 is a bottom view schematically showing a contact body held by the contact state detection apparatus shown in FIG. 1.

Although the contact body 110 can be suitably formed in accordance with the purpose for which the contact body 110 is brought into contact with the object WK, the contact body 110 must be made of a material which deforms upon contact with the object WK to make it possible to detect a state in which the contact body 110 is in contact with the object WK and is pressed against the object WK (hereinafter simply referred to as a "pressed state"). In the present embodiment, the contact body 110 is a gauge head for measuring the volume resistivity of the object WK by the four-probe measurement method. More specifically, as shown in FIG. 2, four probes 113 each having the shape of a thin plate-like needle are formed at the left end (distal end) of a substrate 112 having electronic circuit wiring lines 111 formed thereon such that the probes 113 project from the distal end. Each of the probes 113 is a cantilever of silicon which projects by about 50 μm from the substrate 112 and has a width of about 6 μm and a thickness of about 1 μm. The cantilever is coated with titanium. The probes 113 are arranged in the widthwise direction with a pitch of about 10 μm and are connected to the electronic circuit wiring lines 111 at the distal end of the substrate 112. FIG. 2 is a view of the contact body 110 as viewed from the bottom side, with the probes 113 being depicted in an exaggerated manner.

The main components of the approach stage unit 120 are a workpiece stage section 121, a drive base section 122, and a contact body approach section 123. The workpiece stage section 121 is a plate-like table which holds the object WK detachably mounted on the table. This workpiece stage section 121 is supported by the drive base section 122 in an attitude such that the upper surface of the workpiece stage section 121 becomes horizontal. The drive base section 122 displaces the workpiece stage section 121 in the direction of an X-axis shown in FIG. 1 and in the direction of a Y-axis orthogonal to the X-axis direction while supporting the workpiece stage section 121.

Specifically, the drive base section 122 includes unillustrated X-axis and Y-axis actuators, the operations of which are controlled by a computer unit 140 to be described later. The operations of these actuators are controlled to displace the workpiece stage section 121 in the X-axis direction and the Y-axis direction. Each of the X-axis and Y-axis actuators is composed of an electric motor for coarse movement and a piezoelectric element made of PZT (lead-zirconate-titanate) or the like for fine movement, and can move the workpiece stage section 121 in the direction of the corresponding axis at a coarse feed speed (mm/sec) or a fine feed speed (nm/sec).

The contact body approach section 123 displaces the contact body 110, which is brought into contact with the object WK, in a Z-axis direction (the vertical direction in FIG. 1) orthogonal to the X-axis direction and the Y-axis direction while supporting one end of the contact body 110. The contact body approach section 123 is mainly composed of a contact body holding section 123a and a column 123b. The contact body holding section 123a is a member for removably holding the contact body 110 in an inclined attitude with respect to the upper surface of the workpiece stage section 121, namely, an inclined attitude with respect to the upper surface of the object WK mounted on the workpiece stage section 121. The column 123b is a drive unit for moving the contact body holding section 123a in the Z-axis direction (the vertical direction in FIG. 1) while supporting one end (the right end) of the contact body holding section 123a.

Specifically, the column 123b includes an unillustrated Z-axis actuator, the operation of which is controlled by the computer unit 140. The operation of this Z-axis actuator is controlled to displace the contact body holding section 123a in the Z-axis direction. Like the X-axis and Y-axis actuators, the Z-axis actuator is composed of an electric motor for coarse movement and a piezoelectric element made of PZT (lead-zirconate-titanate) or the like for fine movement, and can move the contact body holding section 123a in the Z-axis direction at a coarse feed speed (mm/sec) or a fine feed speed (nm/sec).

The column 123b of the contact body approach section 123 is provided with a four-probe measurement circuit 124. The four-probe measurement circuit 124 is an electric circuit for detecting contact of the contact body 110 with the object WK and measuring the electrical conductivity of the object WK. Specifically, the four-probe measurement circuit 124 includes a DC power supply for supplying current to two outside probes of the four probes 113, an ammeter for measuring the current flowing between the two outside probes 113, and a voltmeter for measuring the potential difference between the remaining two inner probes of the four probes 113. The four-probe measurement circuit 124 is controlled by the computer unit 140 and outputs the measured current and voltage to the computer unit 140.

A probe light source 131 and a beam splitter 132 are provided above the workpiece stage section 121 of the approach stage unit 120. The probe light source 131 is a lighting device for emitting light toward the probes 113, which are displaced toward the surface of the object WK on the workpiece stage section 121, such that the contact body 110 is irradiated with light. The operation of the probe light source 131 is controlled by the computer unit 140. In the present embodiment, the probe light source 131 is an LED. The probe light source 131 is slopingly supported above the workpiece stage section 121 by an unillustrated probe light source support mechanism which can change the direction and attitude of the probe light source 131 to thereby freely change the light irradiation position.

The beam splitter 132 is an optical component which enables a portion of incident light to pass therethrough and reflects the remaining portion of the incident light in a direction orthogonal to the direction of incidence. A workpiece light source 133 is provided on the optical axis in the Z-axis direction of the beam splitter 132. The workpiece light source 133 is a lighting device for emitting light toward the surface of the object WK on the workpiece stage section 121. The operation of the workpiece light source 133 is controlled by the computer unit 140. In the present embodiment, the workpiece light source 133 is an incandescent lamp.

A condenser lens 134 and an imaging device 135 are provided on the optical axis in the X-axis direction of the beam splitter 132. The condenser lens 134 is an optical device for focusing the light introduced via the beam splitter 132 onto the imaging device 135. The imaging device 135 is an optical device which is disposed at a position where the light is focused by the condenser lens 134 and which outputs to the computer unit 140 an electric signal representing an image formed on a light receiving surface thereof. In the present embodiment, the imaging device 135 is a CCD image sensor. The beam splitter 132, the workpiece light source 133, the condenser lens 134, and the imaging device 135 are supported above the workpiece stage section 121 by an unillustrated imaging optical system support mechanism which can move them as a single unit to an arbitrary position on the workpiece stage section 121.

The computer unit 140 is composed of a microcomputer including a CPU, ROM, RAM, a hard disc drive, etc. The computer unit 140 controls the operations of the approach stage unit 120, the four-probe measurement circuit 124, the probe light source 131, the workpiece light source 133, and the imaging device 135 by executing an unillustrated control program in accordance with an instruction from an input device 141 composed of a keyboard and a mouse. The computer unit 140 includes a display device 142 composed of a liquid crystal display. The display device 142 displays the operation state of the computer unit 140, the state of execution of the control program, and an image captured by the imaging device 135. In the present embodiment, the computer unit 140 is a personal computer.

Figure 5:
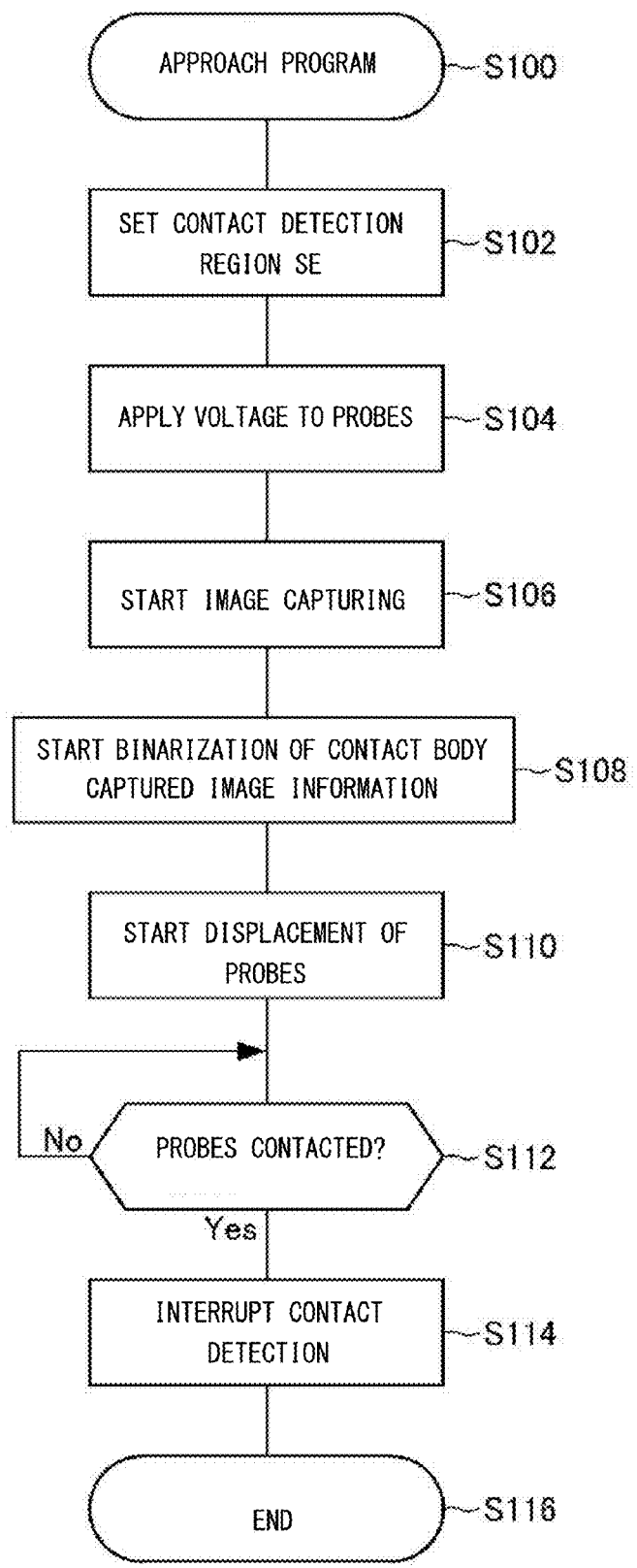
FIG. 5 is a flowchart of an approach program executed by a computer unit which forms the contact state detection apparatus shown in FIG. 1.

By executing an approach program shown in FIG. 5, the computer unit 140 displaces the contact body 110 which is held by the contact body holding section 123a of the contact body approach section 123 toward the object WK and brings the contact body 110 into contact with the object WK. The computer unit 140 can display the captured image output from the imaging device 135 without modification on the display device 142. The computer unit 140 also converts the captured image to a monochrome image and displays the monochrome image. Specifically, the computer unit 140 binarizes the captured image information representing the captured image on a pixel-by-pixel basis in accordance with the brightness (also called lightness) corresponding to the amount of received light to thereby obtain an monochrome image in which a portion where the brightness of pixels represented by the captured image information is equal to or greater than a predetermined value is displayed as white and a portion where the brightness of pixels represented by the captured image information is less than the predetermined value is displayed as black. The above-mentioned control program including the approach program is stored in the hard disc drive in advance by an operator. The computer unit 140 may be any type of computer so long as it can control the operations of the approach stage unit 120, the four-probe measurement circuit 124, the probe light source 131, the workpiece light source 133, and the imaging device 135.

(Operation of the Contact State Detection Apparatus)

Next, the operation of the electrical conductivity measurement system 100, including the contact state detection apparatus configured as described above, will be described. In the description of operation, a process which relates directly to the present invention, namely, a process of bringing the probes 113 of the contact body 110 into contact with the object WK, will be described. Since the electrical conductivity of the object WK is measured in accordance with an electrical conductivity measurement technique based on the common four-probe method, operations relating to the measurement of the electrical conductivity of the object WK will not be described.

First, an operator sets the object WK, the electrical conductivity of which is to be measured, on the workpiece stage section 121 of the approach stage unit 120 and attaches the contact body 110 to the contact body holding section 123a of the contact body approach section 123 to be held thereby. At this time, the operator sets the object WK on the workpiece stage section 121 such that the surface of the object WK, which surface is to be subjected to electrical conductivity measurement, faces the contact body holding section 123a. The operator also attaches the contact body 110 to the contact body holding section 123a such that the probes 113 of the contact body 110 face the upper surface of the object WK set on the workpiece stage section 121 and are inclined with respect to the upper surface of the object WK as shown in FIG. 1.

Next, the operator positions the probes 113 of the contact body 110 held by the contact body holding section 123a such that the distal ends of the probes 113 are located above a measurement position at which the electrical conductivity of the object WK is to be measured. Specifically, the operator turns the workpiece light source 133 on by operating the input device 141 of the computer unit 140 and starts the operation of the imaging device 135 so as to display a captured image on the display device 142. At this time, the operator instructs the computer unit 140 to display on the display device 142 the image captured by the imaging device 135 without modification. As a result, the images of the contact body 110 and the object WK present within the field of view of the imaging device 135 are displayed on the display screen of the display device 142. Subsequently, the operator moves the image of the probes 113 of the contact body 110 held by the contact body holding section 123a to approximately the center of the display screen of the display device 142. Specifically, the operator adjusts the positions of the beam splitter 132, the workpiece light source 133, the condenser lens 134, and the imaging device 135 as a single body by manually operating the imaging optical system support mechanism (not shown).

Figure 3:
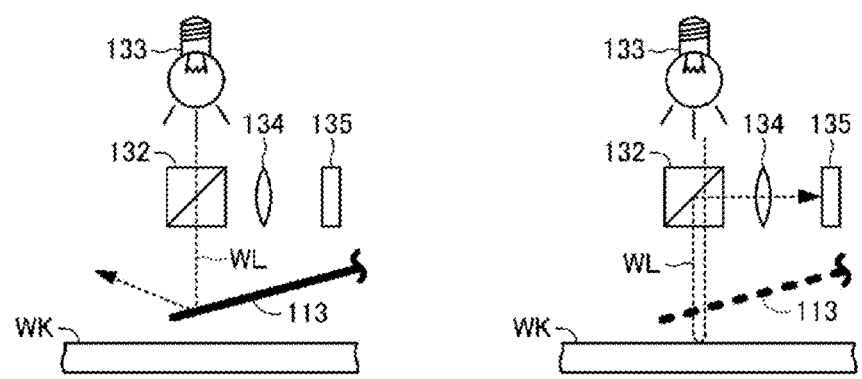

In this positioning operation, the contact body 110 and the object WK are illuminated by the light emitted from the workpiece light source 133 via the beam splitter 132. Of the emitted light, the light WL reaching the contact body 110 is reflected as shown in FIG. 3(A). Since the surface of the contact body 110 illuminated by the light WL is inclined with respect to the central axis of the workpiece light source 133, the greater portion of the light WL is reflected in a direction other than toward the beam splitter 132. The light WL reaching the object WK is reflected as shown in FIG. 3(B). Since the surface of the object WK illuminated by the light WL is perpendicular to the central axis of the workpiece light source 133, the greater portion of the light WL is reflected toward the beam splitter 132 and is guided to the imaging device 135. As a result, the surface of the object WK is displayed on the display screen of the display device 142 as a bright image and the contact body 110 is displayed as a dark shadow. Captured image information representing an image of the object WK illuminated by the workpiece light source 133 and captured by the imaging device 135 corresponds to the object captured image information according to the present invention. In FIG. 3(B), the probes 113 are shown by a broken line to facilitate understanding.

Subsequently, while directly viewing the contact body 110 held by the contact body holding section 123a and viewing the display screen of the display device 142, the operator adjusts the positions of the beam splitter 132, the workpiece light source 133, the condenser lens 134, and the imaging device 135 as a single unit by operating the imaging optical system support mechanism (not shown) such that the image of the probes 113 of the contact body 110 is located at approximately the center of the display screen. Subsequently, the operator positions the contact body 110 relative to the object WK. Specifically, while directly viewing the contact body 110 held by the contact body holding section 123a and viewing the display screen of the display device 142, the operator moves the workpiece stage section 121 in the X-axis and Y-axis directions (shown in FIG. 1) by operating the input device 141 to thereby position the distal ends of the probes 113 of the contact body 110. Thus, the distal ends of the probes 113 of the contact body 110 supported by the contact body holding section 123a are located above a position on the object WK where measurement of electrical conductivity is to be performed.

Figure 4:
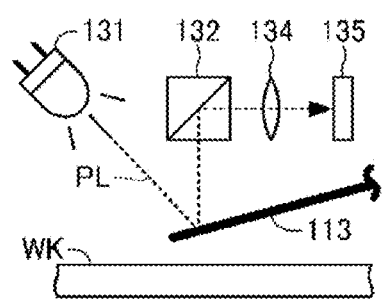
Figure 4:
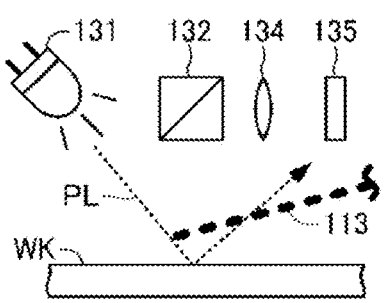
Figure 4:
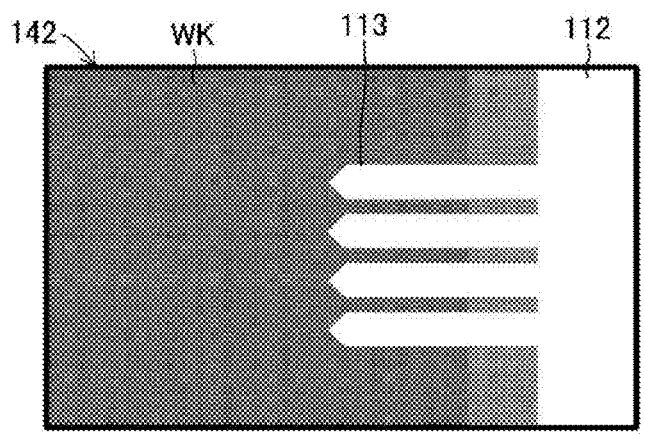

Next, the operator performs positioning of the probe light source 131. This positioning of the probe light source 131 is performed as shown in FIG. 4(A). Namely, the probe light source 131 is positioned such that the greater portion of the light PL emitted from the probe light source 131 reaches the probes 113 of the contact body 110 and the reflected light from the probes 113 is led to the beam splitter 132. The operator turns the workpiece light source 133 off and turns the probe light source 131 on by operating the input device 141 of the computer unit 140. The operator also switches the image displayed on the display apparatus 142 from the captured image to a binary image by operating the input device 141 of the computer unit 140.

As a result of the above-described positioning, the light which is emitted from the probe light source 131 and reflected by the object WK and/or the contact body 110 is led as reflected light to the imaging device 135. Accordingly, the imaging device 135 outputs to the computer unit 140 captured image information corresponding to the reflected light led to the imaging device 135. The computer unit 140 binarizes the captured image information input thereto in accordance with the brightness of each pixel. Thus, of the light led to the imaging device 135, light having a luminous energy greater than a predetermined value is displayed as white on the display screen of the display device 142. Accordingly, while viewing the display screen of the display device 142, the operator adjusts the position of the probe light source 131 by operating a probe support mechanism (not shown) such that the probes 113 are displayed on the display screen as a white image. As a result, as shown in FIG. 4(A), the position of the probe light source 131 is adjusted such that the beam splitter 132 is located on an optical path determined by an angle of reflection equal to the angle of incidence of the light PL emitted from the probe light source 131 and reaching the contact body 110.

The greater part of the light PL emitted from the probe light source 131 and reaching an object other than the contact body 110 and specifically light reaching the surface of the object WK is reflected in a direction different from the direction toward the beam splitter 132 because the surface of the object WK is not parallel to the probes 113 of the contact body 110 as shown in FIG. 4(B). Namely the imaging device 135 is disposed at a position where, of the light PL emitted from the probe light source 131, the reflected light from the surface of the object WK does not directly reach the imaging device 135. In other words, the imaging device 135 is disposed outside the optical path of the reflected light. Therefore, as shown in FIG. 4(C), the images of the probes 113 of the contact body 110 are displayed in white on the display screen of the display device 142, and images other than those of the probes 113 and specifically the image of the surface of the object WK are displayed in black. In FIG. 4(B), the probes 113 are shown by a broken line in order to facilitate understanding. In FIG. 4(C), the displayed images corresponding to the substrate 112, the probes 113, and the object WK are denoted by the reference numerals and symbols for the substrate 112, the probes 113, and the object WK.

Next, the operator performs an operation of bringing the contact body 110 into contact with the object WK. Specifically, the operator operates the input device 141 of the computer unit 140 so as to cause the computer unit 140 to execute a process of bringing the contact body 110 into contact with the object WK. In response to this instruction, the computer unit 140 starts, from step S100, the approach program which is shown in FIG. 5 and adapted to bring the contact body 110 into contact with the object WK. In step S102, the computer unit 140 prompts the operator to set a contact detection region SE.

Figure 6:
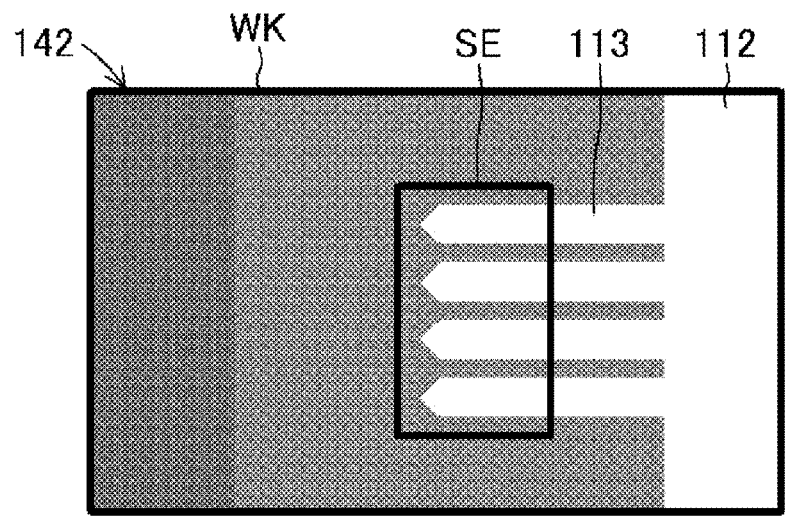
FIG. 6 is an explanatory illustration for showing the setting of a contact detection region on a display device which forms the contact state detection apparatus shown in FIG. 1.

The setting of the contact detection region SE is an operation of selecting captured image information to be used for detection of contact by the contact body 110, from the captured image information output from the imaging device 135, so as to prescribe the sensitivity of detection of the state of the contact body 110 being pressed against the object WK and a pressing force with which the contact body 110 is pressed against the object WK. Namely, in the operation of setting the contact detection region SE, of a portion of the contact body 110 which deforms upon contact with the object WK, a part of that deforming portion is selected for detection of the pressed state of the contact body 110. Specifically, using an unillustrated mouse (pointing device) or the like, the operator adjusts and sets the position and size of the rectangular contact detection region SE, which is displayed on the display screen of the display device 142 as shown in FIG. 6, on the white image of the contact body 110. In the present embodiment, the contact detection region SE has a selection ratio of about 50%. The selection ratio refers to the ratio of the contact detection region SE to a region which includes the white images of the probes 113 displayed on the display screen of the display device 142. Namely, the contact detection region SE is a region which includes the distal halves of the white images of the probes 113 which are displayed on the display screen of the display device 142 such that the images include the distal end portions of the probes 113.

Next, in step S104, the computer unit 140 applies a voltage for contact detection to the probes 113 of the contact body 110. Specifically, the computer unit 140 applies a predetermined voltage to the two outside probes 113 of the four probes 113 of the contact body 110 by controlling the operation of the four-probe measurement circuit 124. Also, the four-probe measurement circuit 124 starts the operation of an ammeter included therein and outputs data indicating the measured current to the computer unit 140.

Next, in step S106, the computer unit 140 starts image capture by the imaging device 135 by controlling the operation of the imaging device 135. As a result, the imaging device 135 outputs the contact body captured image information representing the captured image of the surface of the contact body 110 illuminated by the probe light source 131. In this case, since the light emitted from the probe light source 131 reaches not only the probes 113 of the contact body 110 but also the object WK, the contact body captured image information includes the captured image of the surface of the object WK in addition to the captured image of the probes 113 of the contact body 110. However, reflected light originating from the light reaching the probes 113 of the contact body 110 is mainly led to the imaging device 135. Therefore, in the contact body captured image information, the image of the contact body 110 is higher in brightness than the image of the surface of the object WK.

Next, in step S108, the computer unit 140 starts binarization of the contact body captured image information. Specifically, the computer unit 140 binarizes the contact body captured image information supplied from the imaging device 135 in accordance with the luminous energy (brightness) of each pixel. More specifically, the computer unit 140 converts the contact body captured image information to a monochrome image in which a portion where the brightness of pixels represented by the captured image information is equal to or greater than a predetermined value is displayed in white and a portion where the brightness of pixels represented by the captured image information is less than the predetermined value is displayed in black. Thus, of the contact body captured image information, contact body captured image information corresponding to the contact body 110 represents a white image, and contact body captured image information corresponding to the remaining portion (mainly the surface of the object WK) represents a black image (see FIG. 4(C) and FIG. 6).

Next, in step S110, the computer unit 140 displaces or moves the contact body 110 toward the object WK. Specifically, the computer unit 140 moves the contact body holding section 123a downward along the column 123b, i.e., toward the object WK on the workpiece stage section 121, by starting the operation of the Z-axis actuator (not shown).

Next, in step S112, the computer unit 140 detects whether the contact body 110 is pressed against the object WK. Specifically, the computer unit 140 monitors the data output from the four-probe measurement circuit 124 representing the measured current and determines that the contact body 110 has come into contact with the object WK and entered a pressed state when the measured current becomes greater than 0 A (amperes). Alternatively, the computer unit 140 determines that the contact body 110 has come into contact with the object WK and entered a pressed state when, of all the contact body captured image information output from the imaging device 135 and binarized, substantially the entirety of the portion of the captured image information corresponding to the contact detection region SE (about 90% the entire portion in the present embodiment) changes to represent black.

In the processing for detecting the pressed state of the contact body 110, the phrase "when the measured current output from the four-probe measurement circuit 124 becomes greater than 0 A" refers to the case where a current flows between the two outer probes 113 due to electrical contact with the object WK. This means that both of the two outer probes 113 have come into contact with the surface of the object WK. Also, the phrase "when, of all the contact body captured image information output from the imaging device 135 and binarized, substantially the entirety of the portion of the captured image information corresponding to the contact detection region SE changes to represent black" refers to the case where the reflected light from the probes 113 of the contact body 110 no longer reaches the imaging device 135. This means that the probes 113 deform as a result of the probes 113 coming into contact with the surface of the object WK and pressing the surface, whereby the direction of propagation of the reflected light has changed.

The process in which a portion of the contact body captured image information corresponding to the contact detection region SE changes to represent black will be described more specifically. In the case where the probes 113 of the contact body 110 do not contact the surface of the object WK, as shown in FIG. 4(C) and FIG. 6, the entirety of the probes 113 is displayed on the display screen of the display device 142 as a white image. This is because the greater portion of the reflected light from the probes 113 of the contact body 110 is led to the imaging device 135.

Figure 7:
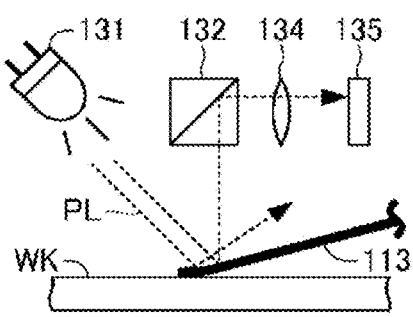
Figure 7:
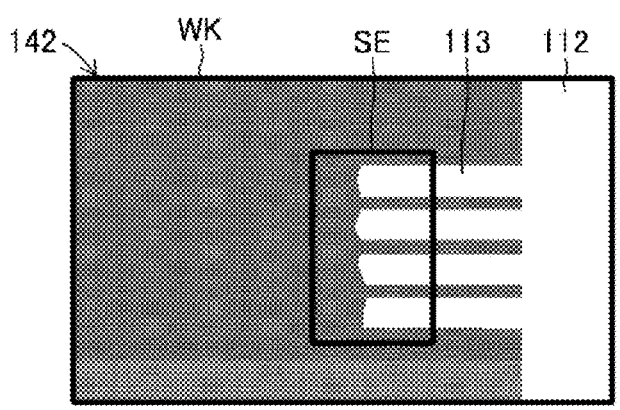

Subsequently, when the distal end portions of the probes 113 start to come into contact with the surface of the object WK as a result of displacement of the probes 113 toward the object WK, as shown in FIG. 7(A), portions of the probes 113 in contact with the surface of the object WK deform. As a result, the direction of propagation of the reflected light from the deformed portions of the probes 113 changes, and the reflected light is no longer led to the workpiece light source 133. Therefore, as shown in FIG. 7(B), the captured images which are displayed on the display device 142 and correspond to the deformed portions (the distal end portions of the probes 113) become black.

Figure 8:
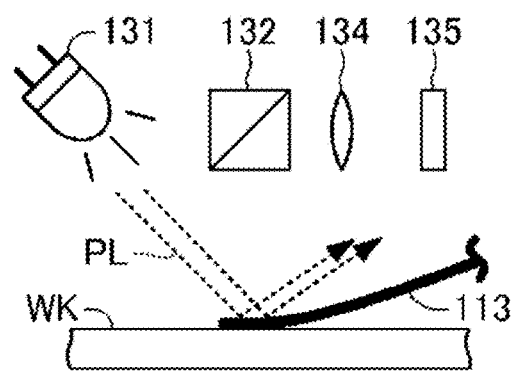
Figure 8:
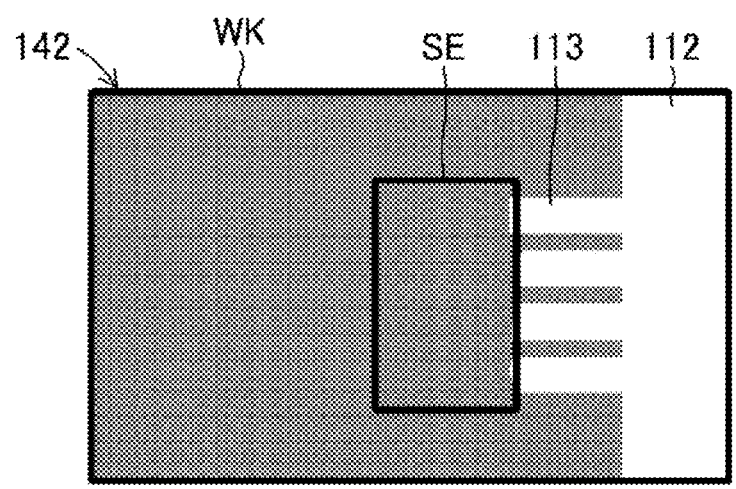

When the probes 113 move further toward the surface of the object WK, as shown in FIG. 8(A), the area of the contact portion of each probe 113 which has deformed and become parallel to the surface of the object WK as a result of pressing the surface of the object WK increases. As a result, the reflected light led from the probes 113 to the imaging device 135 decreases further, and as shown in FIG. 8(B), most of the white portions of the captured images of the probes 113 within the contact detection region SE displayed on the display device 142 become black.

Namely, the computer unit 140 detects the pressed state of the contact body 110 using a change in the area of the reflected light receiving portion (region) represented by the contact body captured image information.

Accordingly, the computer unit 140 repeatedly makes a "No" determination and executes the determination processing of step S112 until the measured current output from the four-probe measurement circuit 124 becomes greater than 0 A, or until substantially the entirety of the portion of the contact body captured image information output from the imaging device 135 and corresponding to the contact detection region SE changes to represent black. While repeatedly executing the determination processing of step S112, the computer unit 140 executes processing to monitor the contact body captured image information and the measured current output from the four-probe measurement circuit 124 every time the contact body 110 is fed toward the object WK by a certain amount (pitch).

When the measured current output from the four-probe measurement circuit 124 becomes greater than 0 A or substantially the entirety of a portion of the contact body captured image information output from the imaging device 135 and corresponding to the contact detection region SE changes to represent black, the computer unit 140 determines in the determination processing of step S112 that the contact body 110 has come into contact with the object WK and entered a pressed state ("Yes" in step S112) and proceeds to step S114. In a period during which the pressed state determination processing of step S112 is executed, the operator can identify anomalous contact of the contact body 110 by monitoring the display screen of the display device 142. For example, in the case where only one of the four probes 113 changes to black, that probe 113 is considered to have come into contact with something and deformed. Therefore, the operator can immediately stop the operation of bringing the contact body 110 into contact with the object WK by operating the input device 141. That is, the contact state detection apparatus of the present invention can not only determine whether the contact body 110 has come into contact with the object WK but can also detect a state of anomalous contact of the contact body 110.

Next, in step S114, the computer unit 140 executes processing to interrupt the detection of the pressed state of the contact body 110. Specifically, the computer unit 140 stops the operations of the Z-axis actuator (not shown), the four-probe measurement circuit 124, and the imaging device 135. Thus, the displacement or movement of the contact body holding section 123a, the application of voltage to the two outer probes 113, and the process of capturing the image of the probes 113 are interrupted. Also, the computer unit 140 interrupts the binarization of the contact body captured image information and displays on the display device 142 a message or the like reporting that the probes 113 of the contact body 110 have come into contact with the surface of the object WK and are in a pressed state. In this case, the computer unit 140 displays on the display device 142 the reason why the computer unit 140 determined that the contact body 110 is pressed against the object WK, namely, whether the computer unit 140 made such a determination on the basis of a change in the measured current or on the basis of a change in the contact body captured image information. Subsequently, in step S116, the computer unit 140 ends the execution of this approach program.

After checking the message or the like displayed on the display device 142, the operator performs different operations depending on the reason why the computer unit 140 determined that the contact body 110 is pressed against the object WK. Namely, in the case where the computer unit 140 determined that the contact body 110 is pressed against the object WK on the basis of a change in the measured current, since electrical contact is established between the probes 113 of the contact body 110 and the object WK, the operator subsequently performs an operation of measuring the electrical conductivity of the object WK by operating the input device 141 of the computer unit 140. In the case where the computer unit 140 determined that the contact body 110 is pressed against the object WK on the basis of a change in the contact body captured image information, the probes 113 of the contact body 110 are considered not to electrically contact the object WK although they are in physical contact with the object WK. In such a case, the measurement of the electrical conductivity of the object WK cannot be performed. Therefore, the operator specifies the reason why electrical contact is not established between the contact body 110 and the object WK and performs an operation of coping with such a failure. After that, the operator causes the computer unit 140 to execute the approach program again. As a result, it is possible to prevent damage to the contact body 110 and the object WK, which damage has conventionally occurred as a result of strong pressing of the probes 113 against the object WK in a state in which no electrical connection is detected between the probes 113 and the object WK.

As can be understood from the above description of operation, according to the above-described embodiment, the contact state detection apparatus applied to the electrical conductivity measurement system 100 illuminates, with the light PL, a deformable portion of the contact body 110 which deforms upon contact with the object WK and detects the pressed state of the contact body 110 against the object WK on the basis of a change in reflected light represented by the contact body captured image information obtained by capturing the image of the contact body 110 which moves toward the object WK. Namely, the contact state detection apparatus detects the pressed state of the contact body 110 against the object WK by detecting, from a change in the contact body captured image information, a change in the reflected light from the deformable portion which has deformed as a result of contact of the contact body 110 with the object WK. The detection of the reflected light from the contact body 110 is performed by capturing the image of a region including the above-mentioned deformable portion of the contact body 110 by the imaging device 135 composed of a CCD image sensor. Namely, it is not necessary to finely adjust the position from which the light PL is emitted and the position at which the reflected light is received. Therefore, the number of optical components for determining the position at which light PL is irradiated on the contact body 110 and positioning the reflected light from the contact body 110 in relation to a light receiving element can be decreased, and the man-hours required for alignment adjustment can also be decreased. Also, since the contact state detection apparatus detects the pressed state of the contact body 110 on the basis of mechanical deformation of the contact body 110, the pressed state of the contact body can be detected accurately even in the case where an insulating region, such as oxide film, is formed on a target contact portion of the object WK with which the contact body 110 comes into contact. Therefore, damage to the contact body 110 and the object WK caused by strong pressing of the contact body 110 against the object WK can be prevented. As a result, the pressed state of the contact body 110 against the object WK can be detected accurately by a simple configuration without damaging the contact body 110 or the object WK.

(Various Modifications)

The present invention is not limited to the above-described embodiment, and it may be modified in various ways without departing from the object of the present invention. In the modifications described below, structural portions which are shown in the reference drawings and are identical to those of the above-described embodiment are denoted by reference numerals which are the same as or correspond to those used for the corresponding structural portions of the above-described embodiment, and descriptions thereof will not be repeated.

For example, in the above-described embodiment, the pressed state of the contact body 110 is detected while the contact detection region SE having a selection ratio of about 50% is set for the contact body captured image information obtained by capturing the contact body 110. However, the size and position of the contact detection region SE may be freely set in accordance with the purpose of detecting the pressed state of the contact body 110. For example, by increasing the size of the contact detection region SE (increasing the selection ratio), the area of a white portion used for detecting the pressed state of the contact body 110 increases, whereby the sensitivity of detection of the pressed state can be lowered. This means that by increasing the size of the contact detection region SE, it is possible to increase the force with which the contact body 110 is pressed against the object WK when the pressed state of the contact body 110 is detected. Accordingly, the pressing force with which the contact body 110 is pressed against the object WK can be prescribed through use of the spring constant of the material which constitutes the contact body 110, and the pressing force of the contact body 110 can be specified on the basis of the contact body captured image information. On the other hand, by decreasing the size of the contact detection region SE (decreasing the selection ratio), the area of the white portion used for detecting the pressed state of the contact body 110 decreases, and the S/N ratio increases. Therefore, the sensitivity of detection of the pressed state can be increased.

The sensitivity of detection of the pressed state of the contact body 110 can be increased by positioning the contact detection region SE at the distal end of the contact body 110 (the probes 113). Conversely, the sensitivity of detection of the pressed state of the contact body 110 can be decreased by positioning the contact detection region SE at the proximal end of the contact body 110 (the probes 113). A portion of the contact body 110 (e.g., only one probe 113) may be used for detection of the pressed state by adjusting the size and position of the contact detection region SE. Also, two or more contact detection regions SE may be provided, and their positions and sizes may be individually set. For example, by setting a different contact detection region SE for each probe 113, the pressed state of each probe 113 can be individually detected. Namely, the detection range of the pressed state, the sensitivity of contact detection, and the pressing force of the contact body 110 against the object WK can be freely set by appropriately setting the size, position, and number of the contact detection region(s) SE on the deformable portion of the contact body 110 represented by the contact body captured image information.

In the above-described embodiment, the pressed state of the contact body 110 is detected through use of a portion (in the above-described embodiment, the selection ratio is about 50%) of the contact body captured image information obtained by capturing the image of the contact body 110 by the imaging device 135. However, the pressed state of the contact body 110 can of course be detected through use of all the contact body captured image information output from the imaging device 135.

In the above-described embodiment, the contact body 110 is determined to have been pressed against the object WK when of the contact body captured image information output from the imaging device 135, substantially all the captured image information corresponding to the contact detection region SE (about 90% of the contact body captured image information in the above-described embodiment) has changed to represent black. Namely, the contact state detection apparatus detects the pressed state of the contact body on the basis of a change in the area of the reflected light represented by the contact body captured image information. However, the percent (amount) of change from a white image to a black image in the contact body captured image information, which serves as a criterion for determining whether or not the contact body 110 is in the pressed state, can be is suitably determined in accordance with the accuracy in detecting the pressed state of the contact body 110 and is not limited to the percent employed in the above-described embodiment. Namely, when a small change percentage (amount) is used as the criterion for determining whether or not the contact body 110 is in the pressed state, the accuracy in detecting the pressed state of the contact body 110 increases, and when a large change percentage (amount) is used as the criterion for determining whether or not the contact body 110 is in the pressed state, the accuracy in detecting the pressed state of the contact body 110 decreases.

The pressed state of the contact body 110 may be detected on the basis of a change in the position and/or shape of the reflected light represented by the contact body captured image information, rather than by using the change in the area of the reflected light. Namely, the contact state detection apparatus can detect the pressed state of the contact body on the basis of a change in the reflected light region (e.g., the area, position, shape, etc., of the reflected light represented by the contact body captured image information), or in other words, on the basis of a change in a two-dimensional plane in the portion occupied by the reflected light. Also, the contact state detection apparatus can detect the pressed state of the contact body on the basis of a change in the luminous energy (the amount of light) of the reflected light represented by the contact body captured image information.

In the above-described embodiment, an LED is used as the probe light source 131, and an incandescent lamp is used as the workpiece light source 133. However, the light sources used as the probe light source 131 and the workpiece light source 133 are not limited to those employed in the above-described embodiment so long as the light sources can emit the light PL and the light WL which allow the imaging device 135 to capture the images of the contact body 110 and the object WK and output the captured image information. For example, an LED, an incandescent lamp, a fluorescent lamp, a halogen lamp, an HID lamp, or a laser may be used as the probe light source 131 or the workpiece light source 133. Since it is sufficient for the probe light source 131 to illuminate at least the contact body 110 with the light PL, a highly directional light source (e.g., an LED or a laser) is preferably used as the probe light source 131. Since it is sufficient for the workpiece light source 133 to illuminate a region where the object WK comes into contact with the contact body 110, any of various light sources may be used as the workpiece light source 133.

In the above-described embodiment, the object WK is illuminated with the light WL emitted from the workpiece light source 133, and the image of the object WK illuminated with the light WL is captured by the imaging device 135 so as to obtain object captured image information. However, in the case where it is not necessary to ascertain the position of the object WK itself or the positional relation between the contact body 110 and the object WK, the process of obtaining the object captured image information using the workpiece light source 133 and the imaging device 135 is not required. The configuration of the contact state detection apparatus can be simplified by omitting the process of obtaining the object captured image information using the workpiece light source 133 and the imaging device 135.

In the above-described embodiment, the beam splitter 132 is disposed on an optical path determined by an angle of reflection equal to the angle of incidence of the light PL emitted from the probe light source 131 and reaching the contact body 110. Namely, the imaging device 135 is disposed substantially on the optical path determined by the angle of reflection equal to the angle of incidence of the light PL emitted from the probe light source 131 and reaching the contact body 110. This configuration allows the imaging device 135 to efficiently receive the light (reflected light) which is emitted from a light source having a considerable directionality (e.g., an LED) and reflected by the contact body 110, whereby accurate contact body captured image information can be obtained. However, the position of the imaging device 135 is not limited to being on the optical path determined by the angle of reflection, so long as the imaging device 135 can capture the image of the contact body 110 and obtain the contact body captured image information. In particular, in the case where a light source which has low directionality is used as the probe light source 131, the imaging device 135 can be disposed with a relatively large degree of freedom within the range within which the imaging device 135 can receive the reflected light from the contact body 110.

In the above-described embodiment, a CCD image sensor is used as the imaging device 135. However, any image sensors other than a CCD image sensor (e.g., CMOS image sensor) may be used as the imaging device 135 so long as the selected image sensor can obtain the contact body captured image information by capturing the image of the contact body 110. One feature of the present invention is that the number of required optical elements and the man-hours required for alignment (adjustment of the optical axis) can be decreased by detecting the pressed state of the contact body 110 through use of the contact body captured image information obtained by capturing the image of the contact body 110 in a relatively wide region.

In the above-described embodiment, the computer unit 140 detects the pressed state of the contact body 110 using contact body captured image information obtained by binarizing the contact body captured image information received from the imaging device 135. However, the binarization of the contact body captured image information may be omitted, and the contact body captured image information received from the imaging device 135 may be used as is for detection of the pressed state of the contact body 110. For example, the pressed state of the contact body 110 may be detected on the basis of a change in brightness (also called lightness) corresponding to the received luminous energy (the amount of light) represented by the contact body captured image information received from the imaging device 135.

In the above-described embodiment, the contact body 110 is held by the contact body holding section 123a of the contact body approach section 123 such that the contact body 110 has an inclined attitude relative to the surface of the object WK including a target contact portion with which the contact body 110 is to come into contact. Therefore, when the surface of the object WK is illuminated with the light emitted from the probe light source 131, the reflected light from the contact body 110 and the reflected light from the object WK are not led to the imaging device 135 at the same time. As a result, the imaging device 135 can capture only the reflected light from the contact body 110 accurately, whereby the accuracy in detecting the contact of the contact body 110 can be improved. Namely, such an advantageous effect can be attained by merely disposing the imaging device 135 at a position where the reflection from the surface of the object WK, which is a portion of the light PL emitted from the probe light source 131, does not impinge directly onto the imaging device 135, or in other words, by merely disposing the imaging device 135 outside the optical path of the reflected light.

In the above-described embodiment, the contact body approach section 123, which holds the contact body 110 and causes the contact body 110 to approach the object WK, is a constituent element which constitutes the electrical conductivity measurement system 100 but is not an essential constituent element of the contact state detection apparatus. However, by using the contact body approach section 123 as a constituent element of the contact state detection apparatus, the contact state detection apparatus can exhibit the above-described action and effects. Like the contact body approach section 123, the workpiece stage section 121 and the drive base section 122, which hold the object WK and move it relative to the contact body 110 in the X-axis and Y-axis directions, are constituent elements of the electrical conductivity measurement system 100 but are not essential constituent elements of the contact state detection apparatus.

However, in the case where the workpiece stage section 121 and the drive base section 122 are used as constituent elements of the contact state detection apparatus, the pressed state of the contact body 110 can be detected at an arbitrary position on the object WK, whereby the range of use or application of the contact state detection apparatus can be expanded. Namely, the approach stage unit 120 corresponds to the contact body displacement device of the present invention. In this case, the approach stage unit 120 is only required to displace the contact body 110 and the object WK relative to each other, and it is not necessary to have a configuration for displacing only one of the contact body 110 and the object WK. Namely, the approach stage unit 120 may displace either one or both of the contact body 110 and the object WK. Also, the pressed state of the contact body 110 can be detected even when the contact body 110 has an attitude such that the contact body 110 becomes parallel to the surface of the object WK including a target contact portion. In this case, the contact state detection apparatus is preferably configured such that mainly the contact body 110 is illuminated with light and the object WK is hardly illuminated with the light.

In the above-described embodiment, the display device 142 is used to display the image captured by the imaging device 135. Namely, the display device 142 corresponds to the captured image display device of the present invention. The display device 142 enables an operator to perform work while visually checking the contact state of the contact body 110 and the state of the vicinity of the target contact portion of the object WK. Accordingly, in the case where such a visual check is not required, the display device 142 is unnecessary. Namely, since the detection of the pressed state of the contact body 110 is performed by computation by the computer unit 140, the pressed state of the contact body 110 can be detected without displaying the pressed state of the contact body 110.

In the case where an operator detects the pressed state of the contact body 110, the operator needs some display device which allows the operator to check the pressed state of the contact body 110. In this case, since the detection of the pressed state of the contact body 110 itself is performed by the operator, the computation performed by the computer unit 140 so as to detect the pressed state, i.e., the contact state detection device, is unnecessary. Specifically, the operator visually checks a change in the white image of the contact body 110 displayed on the display device 142. When the white image has changed to a prescribed state, the operator determines that the contact body 110 has been pressed against the object WK and stops the movement of the contact body 110 by operating the input device 141. The pressed state of the contact body 110 can be detected by this operation as well.

In the above-described embodiment, the measured current output from the four-probe measurement circuit 124 and the contact body captured image information output from the imaging device 135 are used for the detection of the pressed state of the contact body 110. Thus, when the contact body 110 physically or electrically comes into contact with the object WK, the contact body is determined to have come into contact with the object, whereby the pressed state of the contact body can be detected. Alternatively, when the contact body 110 physically and electrically comes into contact with the object WK, the contact body is determined to be in the pressed state, whereby the pressed state of the contact body can be detected. As a result, the range of use and application of the contact state detection apparatus can be expanded. However, the detection of the pressed state of the contact body 110 can of course be performed using only the contact body captured image information output from the imaging device 135.

In the above-described embodiment, the pressed state of the contact body 110 is detected using the phenomenon that, when the contact body 110 deforms as a result of being pressed against the object WK, the reflected light from the contact body 110 is unable to reach the imaging device 135. However, the present invention is not limited to the above-described embodiment so long as the contact of the contact body 110 is detected by utilizing a change in the direction of propagation of the reflected light which occurs when the contact body 110 deforms as a result of being pressed against the object WK.

Figure 9:
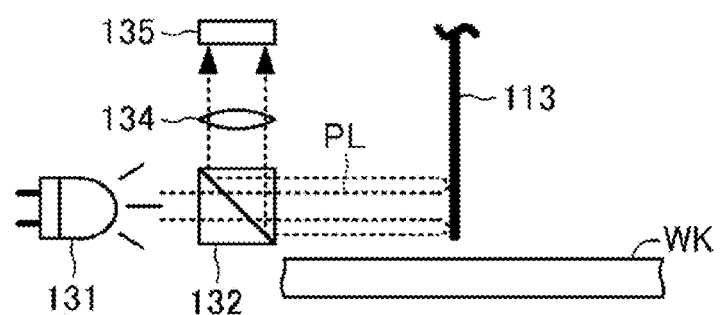
Figure 9:
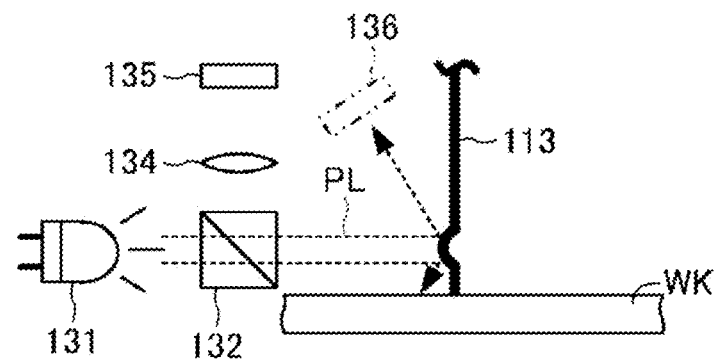

For example, as shown in FIG. 9(A), the probe light source 131 may be configured to emit light PL toward the surface of the contact body 110 in a direction orthogonal to the surface. In this case, when the probes 113 come into contact with the object WK and buckle as shown in FIG. 9(B), a portion of the reflected light from the probes 113 is unable to reach the imaging device 135. Accordingly, the computer unit 140 can detect the pressed state of the contact body 110 by detecting a black portion which is formed due to buckling of the probes 113 at a side surface portion of the contact body 110 represented by white in the contact body captured image information. Namely, the probe light source 131 may have any configuration so long as it is configured to illuminate with the light PL a portion of the contact body 110 which has not yet deformed upon contact with the object WK, or a portion of the contact body 110 which has deformed upon contact with the object WK, i.e., a region including the deformable portion of the contact body 110 which deforms upon contact with the object WK.

In the contact state detection apparatus shown in FIGS. 9(A) and 9(B), in place of or in addition to the beam splitter 132, the condenser lens 134, and the imaging device 135, an imaging device 136 (indicated by a two-dot chain line in FIG. 9(B)) similar to imaging device 135 may be provided on an optical path along which the reflected light from a buckled portion of the probes 113 which buckled as a result of contact with the object WK propagates. When the probes 113 come into contact with the object WK and buckle, a portion of the reflected light from the probes 113 reaches the imaging device 136. Accordingly, the computer unit 140 can detect the pressed state of the contact body 110 by detecting a white portion which is formed, due to buckling of the probes 113 at a side surface portion of the contact body 110 represented by black in the contact body captured image information.

Figure 10:
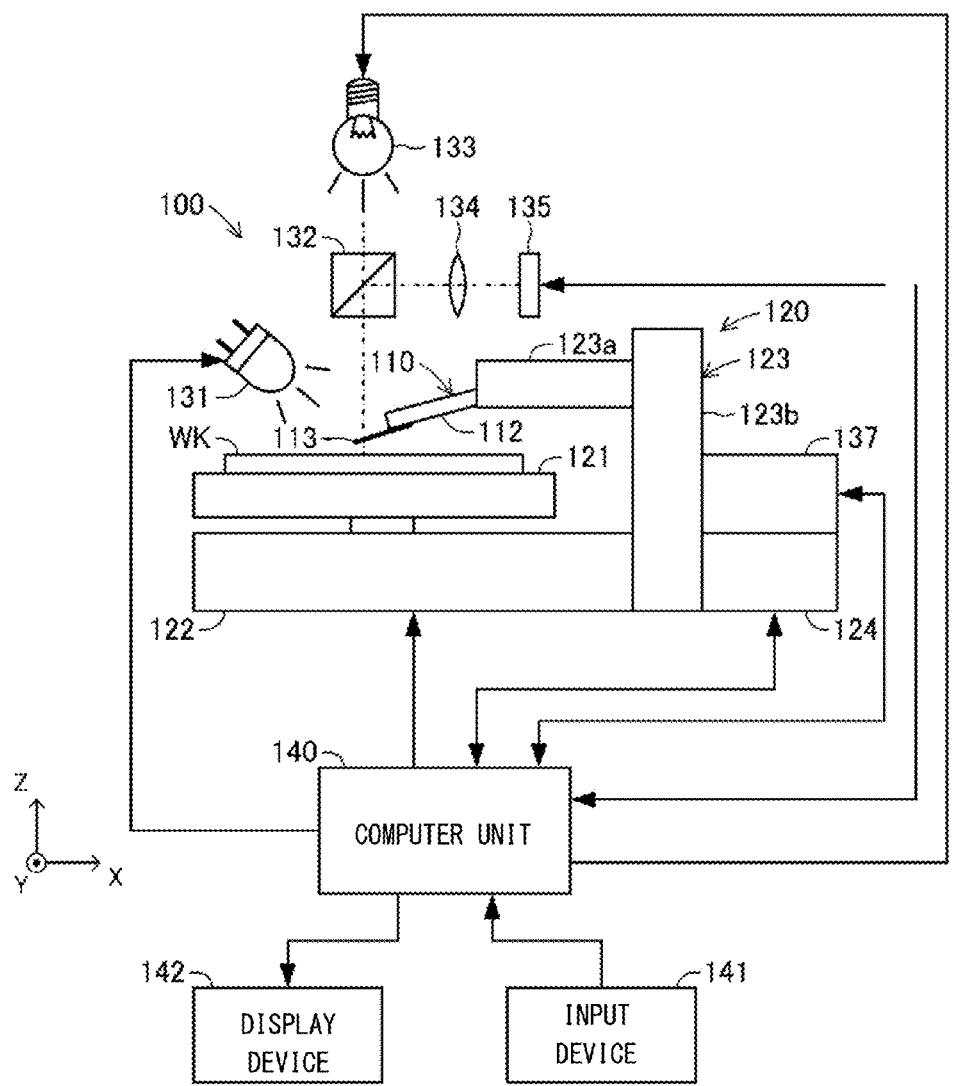
FIG. 10 is a block diagram schematically showing the configuration of an electrical conductivity measurement system including a contact state detection apparatus according to another modification of the present invention.

In the above-described embodiment, in the case where the state of the contact body 110 being pressed against the object WK is detected from a change in the contact body captured image information, the operation of measuring the electrical conductivity of the object WK is not performed because an insulating film may be formed on the surface of the object WK and hinder electrical contact between the probes 113 of the contact body 110 and the object WK. Therefore, in such a case, the electrical conductivity measurement system 100 preferably includes a voltage application device 137 connected to the contact body 110 as shown in FIG. 10. The voltage application device 137 applies a voltage to the contact body 110 so as to cause insulation breakdown between the contact body 110 and the object WK. In the case where the state of the contact body 110 being pressed against the object WK is detected from a change in the contact body captured image information, the electrical conductivity measurement system 100 or the operator operates the voltage application device 137 so as to produce breakdown of the insulating film formed on the surface of the object WK, to thereby guarantee a state in which the probes 113 of the contact body 110 and the object WK electrically contact each other. Accordingly, after producing breakdown of the insulating film formed on the object WK, the electrical conductivity measurement system 100 or the operator can measure the electrical conductivity of the object WK. As described above, the electrical conductivity measurement system 100 can be configured to continue the measurement of the electrical conductivity of the object WK or interrupt the measurement of the electrical conductivity, depending on the result of the detection of the state of the contact body 110 being pressed against the object WK performed by the contact state detection apparatus.

In the above-described embodiment, the contact state detection apparatus is applied to the electrical conductivity measurement system 100. However, the contact state detection apparatus can be widely applied as a contact state detection apparatus which determines whether or not a contact body moving toward an object has come into contact with the object. For example, the present invention can be applied to probe control in a probe microscope, contact control in a probe-type roughness measuring apparatus, contact control in a microcomputer, contact force measurement and mechanical property evaluation for MEMS components or the like, and contact detection for a microswitch.

Figure 11:
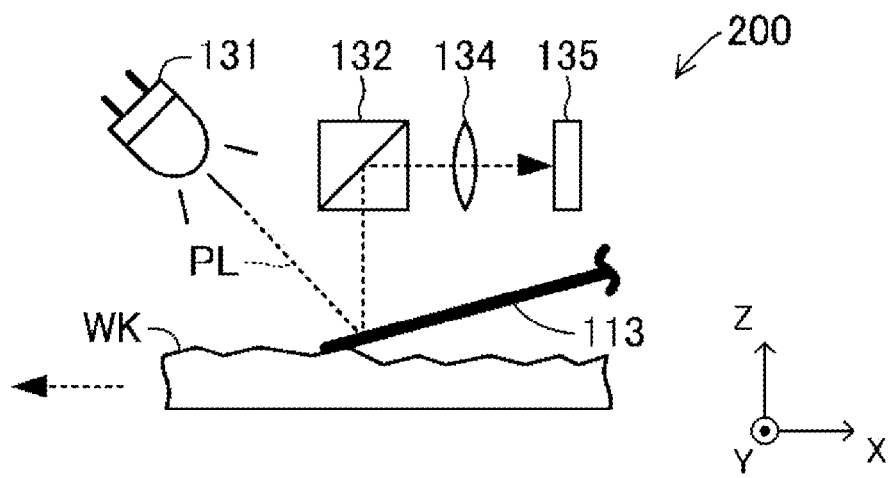
FIG. 11 is a schematic view used for describing a state of use in which light is emitted from a probe light source in a probe-type roughness measurement apparatus including a contact state detection apparatus according to another modification of the present invention.

For example, as shown in FIG. 11, the contact state detection apparatus can be applied to a probe-type roughness measuring apparatus 200. In this case, an unillustrated controller (corresponding to the computer unit 140) of the probe-type roughness measuring apparatus 200 moves a probe 113 and an object WK relative to each other in the X-axis direction in a state in which the distal end of the probe 113 is pressed against the surface of the object WK with a predetermined pressing force.

The controller of the probe-type roughness measuring apparatus 200 can measure the surface roughness of the object WK using the contact body captured information output from the imaging device 135.

Figure 12:
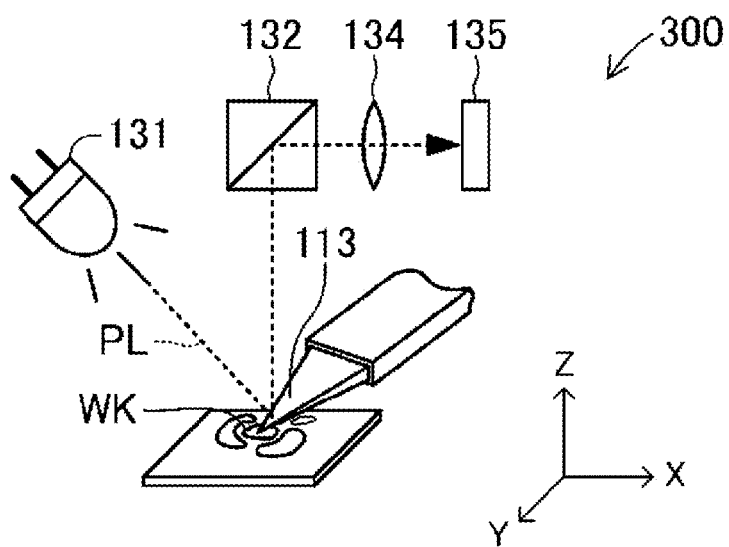
FIG. 12 is a schematic view used for describing a state of use in which light is emitted from a probe light source in a micromanipulator including a contact state detection apparatus according to another modification of the present invention.

Also, as shown in FIG. 12, the contact state detection apparatus can be applied to a micro manipulator 300. In this case, the probe 113 is formed of a plate which generally has a triangular shape as viewed from above and has a pointed distal end. In response to operation of an unillustrated input device (corresponding to the input device 141) by an operator, an unillustrated controller (corresponding to the computer unit 140) of the micro manipulator 300 presses the distal end of the probe 113 against the surface of an object WK (e.g., a cell structure on a slide glass), moves the probe 113 and the object WK relative to each other in the X-axis and Y-axis directions in a state in which the probe 113 is pressed against the surface of an object WK, whereby the object WK is machined or moved. In this case, an operator or the controller of the micro manipulator 300 can monitor the pressed state of the probe 113 against the object WK using the contact body captured image information output from the imaging device 135 or an image displayed on a display device (corresponding to the display device 142) and properly adjust the pressed state.

In this case, the pressed state of the probe 113 against the object WK broadly refers to a state in which the probe 113 is pressed against the object WK by a pressing force applied to the probe 113 from an arbitrary direction. Specifically, the pressed state of the probe 113 against the object WK encompasses not only a state in which the probe 113 presses the surface of the object WK in the Z-axis direction but also a state in which the probe 113 is twisted when the probe 113 is moved in the X-axis direction and/or the Y-direction (i.e., in the X-Y plane) in a state in which the probe 113 presses the surface of the object WK in the Z-axis direction.

This application incorporates by reference the disclosures of Japanese Patent Application No. 2010-159971 and International Application No. PCT/JP2011/065959.

What is claimed is:

1. A contact state detection apparatus comprising:
 a light irradiating device which irradiates a region including a deformable portion of a contact body with light, which portion deforms upon contact with an object;
 an image capturing device which receives light reflected from the contact body and captures an image of the deformable portion of the contact body and outputs contact body captured image information; and
 a contact state detection device which receives the contact body captured image information and detects the degree to which the contact body is pressed against the object after having come into contact with the object based on a change in the area of the captured image having at least a prescribed brightness.

2. A contact state detection apparatus as claimed in claim 1, wherein the contact state detection device binarizes the contact body captured image information in accordance with the brightness of the captured image, and detects the degree to which the contact body is pressed against the object after having come into contact with the object based on the binarized contact body captured image information.

3. A contact state detection apparatus as claimed in claim 2, wherein the contact state detection device assigns a first binary value to each pixel of the captured image having at least a prescribed brightness and a second binary value to each pixel of the captured image having less than the prescribed brightness, and the contact state detection device detects the degree to which the contact body is pressed against the object based on the number of pixels assigned the first binary value.

4. A contact state detection apparatus as claimed in claim 1, further comprising a contact body displacement device which displaces the contact body toward the object while holding the contact body in an attitude such that the contact body is inclined with respect to a surface of the object including a target contact portion with which the contact body comes into contact.

5. A contact state detection apparatus as claimed in claim 4, wherein the contact body displacement device displaces the contact body relative to the object along the surface of the object including the target contact portion with which the contact body comes into contact.

6. A contact state detection apparatus as claimed in claim 1, further comprising a captured image display device which displays the image captured by the image capturing device.

7. A contact state detection apparatus as claimed in claim 1, further comprising an electrical contact detection device which detects electrical contact between the object and the contact body, both of which are formed of a conductor.

8. An electrical conductivity measurement system comprising:
  a contact state detection apparatus as claimed in claim 1; and
  an electrical conductivity measurement device connected to the contact body of the contact state detection apparatus and measuring the electrical conductivity of the object by bringing the contact body into contact with the object, the contact state detection apparatus detecting the degree to which the contact body is pressed against the object after having come into contact with the object, wherein the electrical conductivity measurement device performs the measurement of the electrical conductivity of the object in accordance with the result of detection of the contact body being pressed against the object detected by the contact state detection device.

9. An electrical conductivity measurement system as claimed in claim 8, further comprising a voltage application device connected to the contact body and applying to the contact body a voltage for causing insulation breakage between the contact body and the object.

10. A contact state detection apparatus as claimed in claim 1, further comprising:
  an object illumination device which illuminates the object with light; and
  a beam splitter disposed along an optical path between the object illumination device and the object and disposed so as to reflect light from the object illumination device which is reflected from the object and light from the light irradiating device which is reflected from the contact body along an optical path to the image capturing device.

11. A contact state detection apparatus as claimed in claim 10 wherein the image capturing device captures an image of the object based on light reflected from the beam splitter and outputs object captured image information.

12. A contact state detection apparatus as claimed in claim 1, wherein the contact state detection device is constituted by a computer.

13. A contact state detection apparatus as claimed in claim 1, wherein the contact body comprises a substrate and a plurality of probes supported by the substrate and extending from the substrate in the form of cantilevers, each probe has a width and a distal end for contacting the object, the light irradiating device irradiates the distal end of each probe over the entire width of each probe, and the image capturing device captures an image including the distal end of each probe over the entire width of each probe.

14. A contact state detection apparatus as claimed in claim 13, wherein the light irradiating device irradiates the entire width of each probe from the distal end of each probe to the substrate, and the image capturing device captures an image including the entire width of each probe from the distal end of each probe to the substrate.

15. A contact state detection apparatus as claimed in claim 13 including an input device which enables a user of the contact state detection apparatus to designate a contact detection region in the captured image, wherein the contact state detection device detects the degree to which the contact body is pressed against the object based on a change in the area of the contact detection region having at least a prescribed brightness.

16. A contact state detection apparatus as claimed in claim 15 wherein the contact detection region includes the distal end of each probe over the entire width of each probe.

17. A contact state detection method comprising:
  irradiating a region including a deformable portion of a contact body with light, which portion deforms upon contact with an object;
  capturing an image of the deformable portion of the contact body and outputting contact body captured image information; and detecting the degree to which the contact body is pressed against the object after having come into contact with the object based on a change in the area of the captured image having at least a prescribed brightness.

18. An electrical conductivity measurement method comprising:
  detecting the degree to which a contact body is pressed against an object after having come into contact with the object by the contact state detection method as claimed in claim 12; and
  measuring the electrical conductivity of the object in accordance with the result of detection of the contact body being pressed against the object.

19. A contact state detection method as claimed in claim 17 including assigning a first binary value to each pixel of the captured image having at least a prescribed brightness and a second binary value to each pixel of the captured image having less than the prescribed brightness, and detecting the degree to which the contact body is pressed against the object based on the number of pixels assigned the first binary value.

20. A contact state detection method as claimed in claim 13, wherein the contact body comprises a substrate and a plurality of probes supported by the substrate and extending from the substrate in the form of cantilevers, each probe has a width and a distal end for contacting the object, and the method includes irradiating the distal end of each probe over the entire width of each probe and capturing an image including the distal end of each probe over the entire width of each probe.

* * * * *

UNITED STATES PATENT AND TRADEMARK OFFICE
CERTIFICATE OF CORRECTION

PATENT NO.       : 9,118,331 B2
APPLICATION NO.  : 13/744587
DATED            : August 25, 2015
INVENTOR(S)      : Iwata et al.

Page 1 of 1

It is certified that error appears in the above-identified patent and that said Letters Patent is hereby corrected as shown below:

In the Claims

Column 26, line 48 (claim 18, line 6), change "claim 12" to --claim 17--.

Column 26, line 60 (claim 20, line 2), change "13" to --17--.

Signed and Sealed this
Nineteenth Day of January, 2016

Michelle K. Lee
*Director of the United States Patent and Trademark Office*